United States Patent
Polcik et al.

(10) Patent No.: US 11,767,587 B2
(45) Date of Patent: Sep. 26, 2023

(54) SPUTTER TARGET AND METHOD FOR PRODUCING A SPUTTER TARGET

(71) Applicant: PLANSEE COMPOSITE MATERIALS GMBH, Lechbruck Am See (DE)

(72) Inventors: Peter Polcik, Lechbruck Am See (DE); Szilard Kolozsvari, Lechbruck Am See (DE); Paul Mayrhofer, Neckenmarkt (AT); Helmut Riedl, Kirchberg Am Walde (AT)

(73) Assignee: Plansee Composite Materials GmbH, Lechbruck am See (DE)

( * ) Notice: Subject to any disclaimer, the term of this patent is extended or adjusted under 35 U.S.C. 154(b) by 177 days.

(21) Appl. No.: 16/489,435

(22) PCT Filed: Feb. 19, 2018

(86) PCT No.: PCT/EP2018/054041
§ 371 (c)(1),
(2) Date: Aug. 28, 2019

(87) PCT Pub. No.: WO2018/158101
PCT Pub. Date: Sep. 7, 2018

(65) Prior Publication Data
US 2019/0368029 A1  Dec. 5, 2019

(30) Foreign Application Priority Data
Feb. 28, 2017  (AT) ................ GM 46/2017

(51) Int. Cl.
*C23C 14/34* (2006.01)
*C22C 14/00* (2006.01)
(Continued)

(52) U.S. Cl.
CPC .......... *C23C 14/3414* (2013.01); *C22C 14/00* (2013.01); *C23C 14/0036* (2013.01);
(Continued)

(58) Field of Classification Search
CPC ............ C23C 14/3414; C23C 14/0036; C23C 14/0641; C23C 14/06; C22C 14/00;
(Continued)

(56) References Cited

U.S. PATENT DOCUMENTS 4,950,327 A * 8/1990 Eck .......................... B22F 3/24
                                                              419/12
8,992,748 B2   3/2015 Ivanov et al.
(Continued)

FOREIGN PATENT DOCUMENTS

AT           14346 U1 *  9/2015 .......... H01J 37/3426
CN        H08120445 A    5/1996
(Continued)

OTHER PUBLICATIONS

Chemistry Libretexts. Workfunction Values (Reference Table). (Nov. 2, 2020). Retrieved May 18, 2021, from https://chem.libretexts.org/@go/page/41952 (Year: 2020).*
(Continued)

*Primary Examiner* — Jennifer Wecker
*Assistant Examiner* — Patrick S Ott
(74) *Attorney, Agent, or Firm* — Laurence A. Greenberg; Werner H. Stemer; Ralph E. Locher

(57) ABSTRACT

A target for use in a physical vapor deposition process includes a matrix composed of a composite material selected from the group consisting of aluminum-based material, titanium-based material and chromium-based material and all combinations thereof. The matrix is doped with doping elements and the doping elements are embedded as constituents of ceramic compounds or aluminum alloys in the
(Continued)

matrix. The doping elements are selected from the group of the lanthanides: La, Ce, Nb, Sm and Eu. A process for producing such a target and a use of such a target in a physical vapor deposition process are also provided.

14 Claims, 2 Drawing Sheets

(51) Int. Cl.
*C23C 14/00* (2006.01)
*C23C 14/06* (2006.01)
*H01J 37/34* (2006.01)
*B22F 3/17* (2006.01)

(52) U.S. Cl.
CPC ...... *C23C 14/0641* (2013.01); *H01J 37/3426* (2013.01); *B22F 3/17* (2013.01); *B22F 2301/205* (2013.01)

(58) Field of Classification Search
CPC ... C22C 1/0416; C22C 1/0458; C22C 21/003; C22C 30/00; C22C 32/0036; C22C 32/0031; C22C 32/0026; C22C 32/0073; C22C 32/0047; C22C 21/00; C22C 28/00; C22C 29/005; H01J 37/3426; B22F 3/17; B22F 2301/205
See application file for complete search history.

(56) References Cited

U.S. PATENT DOCUMENTS

| | | | |
|---|---|---|---|
| 2002/0014406 | A1 | 2/2002 | Takashima |
| 2008/0138620 | A1 | 6/2008 | Nadaud et al. |
| 2008/0253925 | A1 | 10/2008 | Xue et al. |
| 2008/0260478 | A1* | 10/2008 | Hovsepian ............... C23C 28/42 407/119 |
| 2009/0186230 | A1* | 7/2009 | Sun ....................... C22C 1/0425 204/192.15 |
| 2009/0229976 | A1 | 9/2009 | Kato et al. |
| 2010/0187093 | A1* | 7/2010 | Kuribayashi ......... C23C 14/067 204/192.1 |
| 2010/0260561 | A1* | 10/2010 | Moriguchi ............ C23C 28/048 407/119 |
| 2016/0002767 | A1* | 1/2016 | Ramm ................. H01J 37/3255 428/155 |

FOREIGN PATENT DOCUMENTS

| | | | |
|---|---|---|---|
| CN | 101395296 | A | 3/2009 |
| CN | 101962721 | A | 2/2011 |
| CN | 102041474 | A * | 5/2011 |
| CN | 102905495 | A * | 1/2013 |
| CN | 104183790 | A | 12/2014 |
| CN | 104451277 | A * | 3/2015 |
| CN | 104480444 | A | 4/2015 |
| CN | 104480444 | A * | 4/2015 |
| GN | 106319454 | A | 1/2017 |
| JP | H07157835 | A | 6/1995 |
| JP | 08151269 | A * | 6/1996 |
| JP | 2000199054 | A | 7/2000 |
| JP | 3084402 | B1 | 9/2000 |
| JP | 2000297365 | A | 10/2000 |
| JP | 2001181838 | A | 7/2001 |
| JP | 2002194536 | A | 7/2002 |
| JP | 2006097070 | A | 4/2006 |
| JP | 2013067835 | A | 4/2013 |
| WO | 2011062450 | A2 | 5/2011 |
| WO | 2016153073 | A1 | 9/2016 |

OTHER PUBLICATIONS

CN-104480444-A Translation (Year: 2015).*
JP-08151269-A Translation (Year: 1996).*
CN-102041474-A Translation (Year: 2011).*
CN-102905495-A Translation (Year: 2013).*
AT-14346-U1 Translation (Year: 2015).*
CN-104451277-A Translation (Year: 2015).*
Yang, et al., Impurity scavenging, microstructural refinement and mechanical properties of powder metallurgy titanium and titanium alloys by a small addition of cerium silicide, 2013, Materials Science & Engineering A, 573, 166-174 (Year: 2013).*
Yang, et al., The effect of lanthanum boride on the sintering, sintered microstructure and mechanical properties of titanium and titanium alloys, 2014, Materials Science & Engineering A, 618, 447-455 (Year: 2014).*
P. H. Mayrhofer et al., "Superior oxidation resistance of the chemically complex but structurally simple Ti—Al—Ta—Ce—Si—La—B-nitride", Materials & Design vol. 227, 2023, 111722, ISSN 0264-1275, https://doi.org/10.1016/j.matdes.2023.111722.

* cited by examiner

SPUTTER TARGET AND METHOD FOR PRODUCING A SPUTTER TARGET

BACKGROUND OF THE INVENTION

Field of the Invention

The present invention relates to a target for use in a physical vapor deposition process, having a matrix composed of a composite material selected from the group consisting of aluminum-based material, titanium-based material and chromium-based material and all combinations thereof, where the matrix is doped with doping elements. The invention also relates to a process for the powder-metallurgical production of a target intended for use in a physical vapor deposition process, where doping elements are introduced into a metallic powder to produce a powder batch and the powder batch is compacted, and where the metallic powder is selected from the group consisting of aluminum-based material and/or titanium-based material and/or chromium-based material and the invention further relates to the use of such a target in a physical vapor deposition process.

In the prior art, processes of physical vapor deposition (PVD) are widely used for producing a variety of layers. Owing to the wide use spectrum of such layers, coating materials of various types have to be able to be deposited.

Various methods, e.g. vaporization, cathode atomization (sputter deposition) or electric arc vaporization (cathodic arc deposition or arc source vaporization technology), are available in physical vapor deposition.

A target is suitable for use in a PVD process for depositing layers on a substrate material provided for this purpose. For the purposes of the invention, the term "target" refers, in particular, to sputtering targets and targets for electric arc deposition (also referred to as arc cathodes).

The targets are produced by means of various technologies, depending on the material. An in-principle distinction can be made between powder-metallurgical and melt-metallurgical processes. In the case of powder-metallurgical processes, there are many different possibilities which have to be selected according to the composition of the target, taking into account the properties of the integrated elements. Mention may here be made by way of example of pressing, sintering, hot isostatic pressing (HIP), forging, rolling, hot pressing (HP) or spark plasma sintering (SPS), including combinations of these.

In carrying out coating, the targets (also known as coating sources or sources for short) are subjected to thermal stress by the plasma, the electric arc and last but not least by heating in the coating chamber. In order to avoid excessive heating of the coating sources, these are cooled from the rear side. This cooling can be carried out either by direct water cooling of the rear side of the target or by indirect cooling through a rigid copper backing plate or flexible copper membranes.

Targets having various compositions are known in the prior art.

Thus, JP3084402 discloses AlTi targets having a composition of AlxTi1-x-y-zMyRz, where M is one or more elements from the group consisting of W and Mo, R denotes rare earth elements from the group consisting of Y, Ce, La and mischmetals x and $0.05 \leq x \leq 0.7$, $0.02 \leq y \leq 0.25$ and $0.0005 \leq z \leq 0.05$.

CN104480444 describes a target composition comprising 10-50 at % of Ti, 40-90 at % of Al and also contents of Co, Cr, Ta, W, Nb, Mo, Zr, V, B, Si, Y, La, Se and Ce, with 0.1-10 at % of Co, 0.1-20 at % of Cr, 0.1-10 at % of Ta, 0.1-10 at % of W, 0.1-10 at % of Nb, 0.1-10 at % of Mo, 0.1-10 at % of Zr, 0.1-10 at % of V, 0.1-10 at % of B, 0.1-20 at % of Si, 0.1-10 at % of Y, 0.01-5 at % of La, 0.01-5 at % of Ce, 0.01-5 at % of Se.

One of the most important parameters for economical use of the PVD technology is the coating rate, which describes the rate at which growth of the layer on the substrate occurs. The coating rate is, in a first approximation, dependent on the following parameters:

type of PVD technology (e.g. electric arc vaporization, sputtering, HIPIMS, . . . )
power applied to the coating source
number of targets
size of the coating plant
distance between the target and the substrate
rotational speed of the substrate in front of the target
substrate prestressing (bias stress)

The composition of the target itself also has a great influence on the coating rate.

Different elements have, due to their physical properties, different vaporization rates. Particularly important factors here are the bonds present, the size of the elements (atomic radius and atomic mass) and also the work function, namely the work required to transfer an electron into the free, unbound state. The bonds present determine how much impingement energy (particularly in the case of sputtering) is necessary to transfer an atom or cluster of atoms from the target surface into the gas phase. Impact processes involving the working gas (Ar will hereinafter be mentioned as example of the working gas, but this does not constitute a restriction) also result in formation of secondary electrons which in turn lead to the formation of more Ar ions which can sputter further atoms of the target. The effectiveness of these sputtering processes depends very greatly on the energy introduced and first and foremost on the energy density. Only when this is high enough can the target be atomized. Here, the coating rate (also atomization rate, sputtering rate) increases very strongly with increasing energy density and attains saturation only at very high energy densities.

The energy density can be increased by means of higher energy of the impinging Ar ions or be influenced by other parameters of the coating plants (e.g. magnetic fields which increase the interactions of the secondary electrons with the working gas and thus increase the degree of ionization of the latter). However, in particular, a higher energy of the impinging Ar ions also increases the thermal stressing of the target (almost 90% of the energy of the incident Ar ions is converted into heat and only a small percentage performs the desired sputtering). These are essentially all process-control parameters.

SUMMARY OF THE INVENTION

It is an object of the invention to provide a target and a process for producing targets, in the case of which an increased vaporization rate and thus increased coating rate are obtained.

This object is achieved by a target, a process and a use in which doping elements are embedded as constituents of ceramic compounds or aluminum alloys in the matrix and the doping elements are selected from the group consisting of the lanthanides: La, Ce, Nd, Sm and Eu.

The main advantage of the invention is an increased coating rate (and thus faster growth of the layer) which can be achieved even by means of comparatively low doping of the target with the selected elements from the group consisting of the lanthanides: La, Ce, Nd, Sm and Eu.

The invention is based on the recognition by the applicant that the coating rate can be influenced very effectively by addition of doping elements. This is based essentially on two effects:

Firstly, the chosen doping elements from the group consisting of the lanthanides: La, Ce, Nd, Sm and Eu help to utilize the energy present in the impinging Ar ions more effectively in respect of the three-dimensional extent of the interaction region. The selected doping elements act, as a result of their size and mass, as atomic "battering rams" (when they are appropriately homogeneously distributed in the target, as is the case in powder-metallurgically produced targets) which concentrate the available impact energy or the momentum onto a smaller interaction region on the target surface. In this way, the kinetic energy transferred is concentrated on fewer atomic layers and the total energy of the impinging Ar ions can be concentrated on a smaller region. This increases the sputtering rate at a constant energy of the impinging Ar ions and a more efficient sputtering process is obtained. This is also associated with an increase in the secondary electron emission, which in turn leads to a higher degree of ionization of the working gas.

Secondly, the secondary electron emission can also be increased by the selected doping elements from the group consisting of the lanthanides: La, Ce, Nd, Sm and Eu, which have a particularly low electron work function. A lower electron work function means an increased number of secondary electrons and thus an increased probability of formation of ions of the working gas, which in turn can knock out more target atoms.

In the invention, there is a superimposition of the two effects, which significantly increases the sputtering yield.

A further positive effect in reactive sputtering processes is that poisoning of the target surface is more difficult due to the increased energy density (in the more concentrated interaction regions close to the surface of the target by the corresponding elements). The formation of poorly electrically conductive reaction products of the target with the reactive gas (e.g. $N_2$) and the residence thereof on the target surface (which leads to the known poisoning of the target) is made more difficult. When such products are formed, these are promptly removed again by the increased number of Ar ions present and the target thus remains longer (even at relatively high $N_2$ contents of the atmosphere) in the desired metallic sputtering mode.

In arc evaporation processes, the positive effect of the invention is, in particular, the increased energy density at the target surface, which in turn increases the arc events and thus the vaporization rate.

The selected elements from the group consisting of the lanthanides: La, Ce, Nd, Sm and Eu additionally have a positive influence on the layer properties in respect of the achievable hardness or wear resistance.

The doping elements are introduced in the form of ceramic compounds or aluminum alloys into the targets in order to be able to ensure low oxygen contents in the target:

The elements listed here have a high chemical affinity for oxygen and therefore oxidize very quickly in pure metallic or unalloyed form. Were the doping elements to be present in the form of oxides, these would not be electrically conductive and thus be very difficult to bring into the vapor phase in the deposition process. In the form of ceramic compounds such as borides, carbides, nitrides and silicides or Al-based alloys, these elements are largely protected against oxidation.

Cerium disilicide is particularly suitable for the addition of cerium since it is much more resistant to oxidation compared to metallic cerium in the temperature range of target production (up to 350° C.). In addition, cerium disilicide has a high brittleness, as a result of which particularly finely particulate powders can be produced by mechanical comminution (milling). This is advantageous in the powder-metallurgical manufacture of the targets. A particularly homogeneous distribution of the doping element is achieved using finely particulate powders.

An oxygen content in the target of less than 5000 μg/g, preferably less than 3000 μg/g, has additionally been found to be particularly advantageous for the layer properties. In terms of the properties of the deposited nanocrystalline PVD layers, high contents of oxygen lead to weakening of the strength of grain boundaries (softening of the interfaces), which in turn leads to decreases in the hardness and of the E modulus of the layers.

The proportion of elements having a work function of greater than or equal to 4.5 eV is preferably particularly small, preferably less than 10 at %. An undesirable increase in the global (based on the total target) work function can be avoided in this way.

A large difference between the work functions of the elements of which the target consists can also lead to the different grains of which the microstructure of the target consists, e.g. Ti, Al, or CeAl, being ablated at different rates in the PVD process and the chemistry of the layer deposited in this way would therefore also be altered greatly compared to the composition of the target. This effect is undesirable from the point of view of PVD process stability.

BRIEF DESCRIPTION OF THE SEVERAL VIEWS OF THE DRAWING

The invention will be illustrated below with the aid of the figures.

The figures show.

DESCRIPTION OF THE INVENTION

Figure 1:
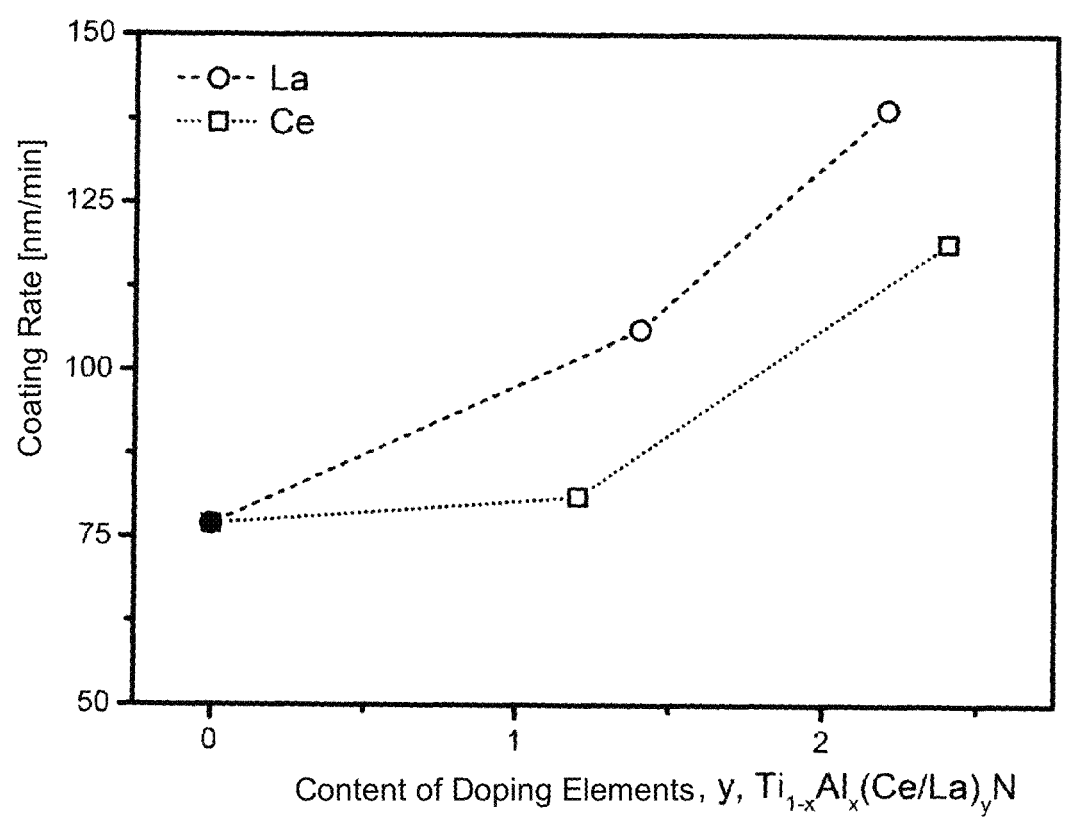
FIG. 1 a graph of the coating rate (also known as deposition rate) as a function of the content of the doping elements Ce and La FIG. 2 an optical micrograph of a TiAlLaB6 target in cross section FIG. 3 an optical micrograph of a TiAlCe target in cross section

FIG. 1 shows the coating rate in nm/min as a function of the content y [at %] of the doping elements Ce and La for a TiAl, TiAlCe and TiAlLaB6 target. The coating rate was determined by means of SEM in the cross-sectional configuration for $Ti_{1-x}Al_xN$, $Ti_{1-x-y}Al_xCe_yN$ and $Ti_{1-x-y}Al_x(LaB_6)_yN$ layers.

The coating rate for the undoped TiAl target corresponds to the point with 0 at % of doping element.

The contents y of the doping elements Ce and La were determined in the deposited layer, and the empirical formula for the composition of the layer is

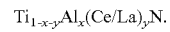

$Ti_{1-x-y}Al_x(Ce/La)_yN.$

The determination of the concentrations of the elements in the layer was carried out by means of EDX.

Targeted alloying of the target with from about 2 to 2.5 at % (Ce or LaB6) made it possible to achieve an increase in the sputtering rate from 50 to 80% for reactive sputtering (gas mixture: Ar/N$_2$).

As a word of explanation, it may be mentioned that the lanthanum is present as LaB6 in the target, but as elemental lanthanum, preferably on lattice sites of Ti or Al, in the layer deposited therefrom.

Figure 2:
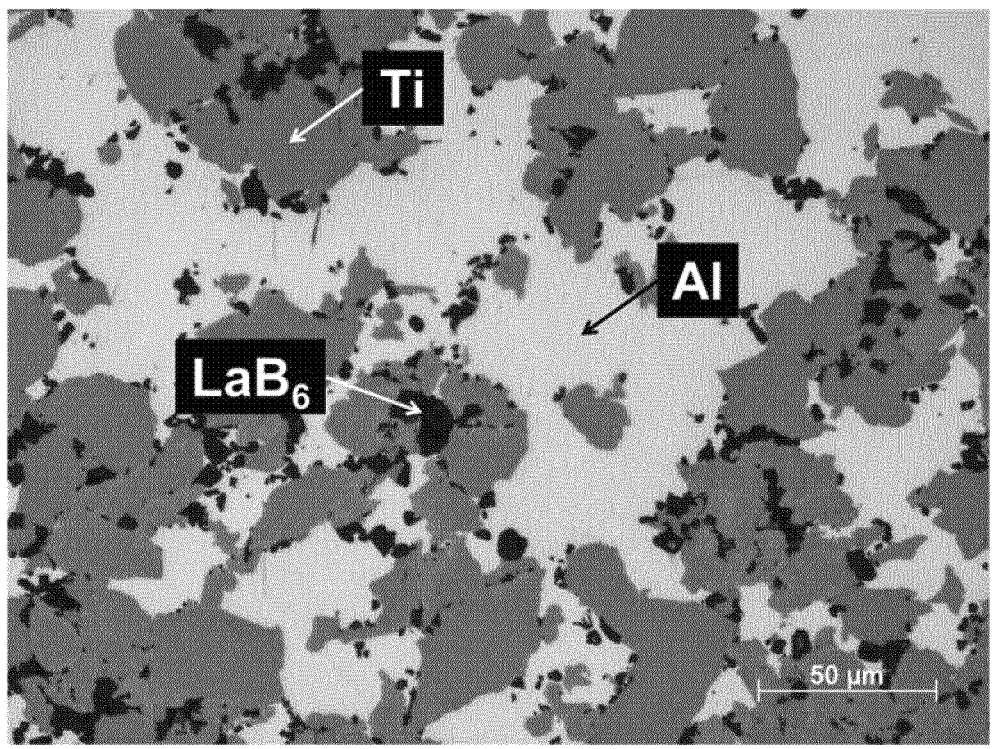

FIG. 2 shows an optical micrograph of a TiAlLaB6 target in cross section. As indicated in the figure, the light-colored regions consist of aluminum, the gray regions consist of titanium and the black regions consist of LaB6 powder particles.

Figure 3:
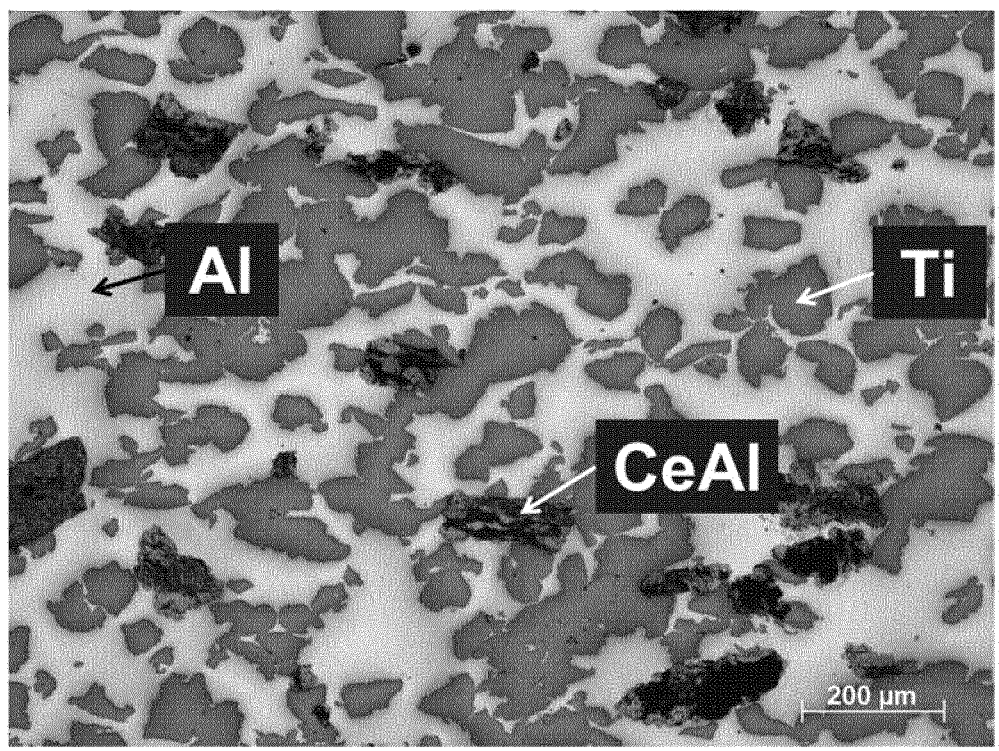

FIG. 3 shows an optical micrograph of a TiAlCe target in cross section. As indicated in the figure, the light-colored regions consist of aluminum, the gray regions consist of titanium powder particles and the fine-grained dark gray agglomerates consist of a CeAl alloy. The black regions in the microstructure correspond to preparation-related cavities (grains broken out on polishing of the sample).

PRODUCTION EXAMPLES

Example 1

For the powder-metallurgical manufacture of targets having the nominal composition of Ti/Al/LaB6 49.0/49.0/2.0 mol %, a powder batch of 800 g was produced by mixing 460.4 g of Ti powder, 259.5 g of Al powder and 80.0 g of LaB6 powder. These weights used correspond to the composition Ti/Al/LaB6 57.6/32.45/10.0 wt %. Based on the elements, this composition corresponds to Ti/Al/La/B 43.8/43.8/1.8/10.6 at %.

The powder batch was subsequently forged at room temperature to give a compact and subsequently at 350° C. to give a blank. A target having the dimensions Ø75×6 mm was subsequently made from the blank by cutting machining. The nature of such a material is shown in FIG. 2 with the aid of an optical micrograph of a cross section of the material. The targets produced in this way, namely disks having the dimensions Ø75×6 mm, were subsequently bonded by means of indium onto copper cathodes of a laboratory coating plant (adapted Leybold Heraeus Z400) and installed in the plant. In a PVD process, the targets were atomized at a total pressure, $p_{total}$, of 0.35 Pa in a gas mixture of Ar and N$_2$ (20% of N$_2$). The targets were operated at a power density of 9.0 W/cm$^2$ for a time of 35 minutes. The resulting layers were deposited on single-crystal Si plates (100 orientation, 20×7×0.38 mm$^3$) and on metallographically polished austenite plates (20×7×0.8 mm$^3$). In order to be able to ensure satisfactory adhesion of the layers, the substrate materials were cleaned in acetone and ethanol before being thermally etched at 430±20° C. in the coating plant. After this thermal etching process, plasma etching was carried out in a pure Ar atmosphere at a total pressure of 6 Pa (duration 10 min). During the coating process, the substrate temperature was 430±20° C., and the bias potential was −50 V. The layers deposited in this way have a very dense morphology and a face-centered cubic crystal structure which was examined by means of scanning electron microscopy (SEM) and X-ray diffraction (XRD). The chemical composition was determined by means of energy-dispersive X-ray spectroscopy (EDX) in the SEM. In order to achieve a reduction in the La content in the deposited layer, pieces of TiAl (8 pieces having dimensions of 4×4×4 mm$^3$ and a chemical composition of Ti/Al 50/50 at %) were placed in the racetrack. Despite a slight covering of the TiAlLaB6 target by the TiAl pieces (less than 10% of the racetrack), a clear increase in the coating rate could be detected—see FIG. 1. The thickness of the layers was about 3650 and 4800 nm, respectively (the 3650 nm were achieved for the layer having about 1.5 at % of La in the layer) for the respective La contents (FIG. 1). The mechanical properties of the Ti$_{1-x-y}$Al$_x$La$_y$N layers were tested by means of nanoindentation and displayed an increase compared to pure Ti$_{1-x}$Al$_x$N which was deposited under the same conditions.

Example 2

For the powder-metallurgical manufacture of targets having the nominal composition of Ti/Al/Ce 49.0/49.0/2.0 mol %, a powder batch of 800 g was produced by mixing 475.3 g of Ti powder, 260.2 g of Al powder and 64.5 g of Ce/Al 88/12 wt % powder. These weights used correspond to the composition Ti/Al/CeAl 59.4/32.5/8.1 wt %.

The powder batch was subsequently forged at room temperature to give a compact and subsequently at 350° C. to give a blank. A target having the dimensions Ø75×6 mm was subsequently made from the blank by cutting machining. The nature of such a material is shown in FIG. 3 with the aid of an optical micrograph of a cross section of the material. The targets produced in this way, having the dimensions Ø75×6 mm, were subsequently bonded by means of indium onto copper cathodes of a laboratory coating plant (adapted Leybold Heraeus Z400) and installed in the plant. In a PVD process, the targets were atomized at a total pressure, $p_{total}$, of 0.35 Pa in a gas mixture of Ar and N$_2$ (20% of N$_2$). The targets were operated at a power density of 9.0 W/cm$^2$ for a time of 45 minutes. The resulting layers were deposited on single-crystal Si plates (100 orientation, 20×7×0.38 mm$^3$) and on metallographically polished austenite plates (20×7×0.8 mm$^3$). In order to be able to ensure satisfactory adhesion of the layers, the substrate materials were cleaned in acetone and ethanol before being thermally etched at 430±20° C. in the coating plant. After this thermal etching process, plasma etching was carried out in a pure Ar atmosphere at a total pressure of 6 Pa (duration 10 min). During the coating process, the substrate temperature was 430±20° C., and the bias potential was −50 V. The layers deposited in this way have a very dense morphology and a face-centered cubic crystal structure which was examined by means of scanning electron microscopy (SEM) and X-ray diffraction (XRD). The chemical composition was determined by means of energy-dispersive X-ray spectroscopy (EDX) in the SEM. The layers had thicknesses of about 3600 and 5000 nm, respectively. These two different layer thicknesses were attained by placing, in order to reduce the Ce content, 8 TiAl pieces (4×4×4 mm$^3$, chemical composition of Ti/Al 50/50 at %) in the racetrack and thus reducing the increase in the coating rate. Despite slight covering of the TiAlCe target by the TiAl pieces (less than 10% of the racetrack), an increase in the coating rate could be detected—see FIG. 1. The mechanical properties of the Ti$_{1-x-y}$Al$_x$Ce$_y$N layers were tested by means of nanoindentation and displayed a slight increase compared to pure Ti$_{1-x}$Al$_x$N which was deposited under the same conditions.

Example 3

For the powder-metallurgical manufacture of targets having the nominal composition of Ti/Al/CeSi2, 39.4/60.6/2.1 mol %, a powder batch of 800 g was produced by mixing 383.2 g of Ti powder, 332.0 g of Al powder and 84.8 g of CeSi2 powder. These weights used correspond to the composition Ti/Al/CeSi2 47.9/41.5/10.6 wt %. Based on the elements, this composition corresponds to Ti/Al/Ce/Si 37.0/57.0/2.0/4.0 at %.

The powder batch was subsequently forged at room temperature to give a compact and subsequently forged at 350° C. to give a blank. A target having the dimensions Ø75×6 mm was subsequently produced from the blank by cutting machining.

The invention claimed is:

1. A target for a physical vapor deposition process, the target comprising:
   a matrix comprised of a composite material selected from the group consisting of aluminum-based material, titanium-based material, chromium-based material and all combinations of said materials; and
   doping elements doping said matrix, said doping elements being embedded as constituents of ceramic compounds in said matrix and said doping elements being selected from the group consisting of La, Ce, Nd, Sm and Eu,
   said doping elements being present in the target in a total concentration in a range from greater than or equal to 1 at % to less than or equal to 10 at %,
   said doping elements being homogeneously distributed in the target and configured to concentrate available impact energy of sputtering gas ions, and
   said elements of said matrix forming a proportion of greater than or equal to 60 at % and less than or equal to 99 at % of the target.

2. The target according to claim 1, wherein said doping elements are present in the target in a total concentration in a range from greater than or equal to 1 at % to less than or equal to 5 at %.

3. The target according to claim 1, wherein said matrix is present as aluminum-based material having a composition of $Al_xM_{1-x}$, where M is one or more elements from the group consisting of Ti, V, Cr, Zr, Nb, Mo, Ta, W, Si and x is greater than 25 at %.

4. The target according to claim 1, wherein said matrix is present as titanium-based material having a composition of $Ti_xM_{1-x}$, where M is one or more elements from the group consisting of V, Cr, Zr, Nb, Mo, Ta, W, Si and x is greater than 50 at %.

5. The target according to claim 1, wherein said matrix is present as chromium-based material having a composition of $Cr_xM_{1-x}$, where M is one or more elements from the group consisting of Ti, V, Zr, Nb, Mo, Ta, W, Si and x is greater than 50 at %.

6. The target according to claim 1, which further comprises an oxygen content in the target of less than 5000 µg/g.

7. The target according to claim 1, which further comprises an oxygen content in the target of less than 3000 µg/g.

8. The target according to claim 1, wherein a proportion of elements having a work function of greater than or equal to 4.5 eV in the target is less than 10 at %.

9. The target according to claim 1, wherein said ceramic compounds are selected from the group consisting of at least one of borides or carbides or nitrides or silicides.

10. The target according to claim 1, wherein said doping element is cerium and is present as a ceramic compound formed of cerium disilicide.

11. The target according to claim 1, wherein said doping element is La and is present as a ceramic compound formed of lanthanum hexaboride.

12. A physical vapor deposition process, which comprises using the target according to claim 1 to carry out the vapor deposition process.

13. A target for a physical vapor deposition process, the target comprising:
   a matrix comprised of chromium-based material; and
   doping elements doping said matrix, said doping elements being embedded as constituents of ceramic compounds in said matrix and said doping elements being selected from the group consisting of La, Ce, Nd, Sm and Eu,
   said doping elements being homogeneously distributed in the target and being present in the target in a total concentration in a range from greater than or equal to 1 at % to less than or equal to 10 at %,
   said doping elements being homogeneously distributed in the target and configured to concentrate available energy, and
   said elements of said matrix forming a proportion of greater than or equal to 60 at % and less than or equal to 99 at % of the target.

14. The target according to claim 13, wherein said doping element is cerium and is present as a ceramic compound formed of cerium disilicide.

* * * * *